US012699003B2

(12) United States Patent
Lu et al.

(10) Patent No.: US 12,699,003 B2
(45) Date of Patent: Aug. 4, 2026

(54) METHOD AND APPARATUS FOR INTERFERENCE REDUCTION IN OPTICAL SENSING RECEIVERS

(71) Applicant: Avago Technologies International Sales Pte. Limited, Singapore (SG)

(72) Inventors: Junjie Lu, Irvine, CA (US); Jing Guo, Irvine, CA (US); Leon Samuel Wang, Irvine, CA (US); Xiaofeng Lin, Irvine, CA (US); Xicheng Jiang, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 585 days.

(21) Appl. No.: 18/139,241

(22) Filed: Apr. 25, 2023

(65) Prior Publication Data
US 2024/0361180 A1     Oct. 31, 2024

(51) Int. Cl.
*G01J 1/44* (2006.01)
*H03H 11/04* (2006.01)

(52) U.S. Cl.
CPC ................ *G01J 1/44* (2013.01); *H03H 11/04* (2013.01); *G01J 2001/444* (2013.01)

(58) Field of Classification Search
None
See application file for complete search history.

(56) References Cited

U.S. PATENT DOCUMENTS

| | | |
|---|---|---|
| 2005/0199813 A1 | 9/2005 | Van Bogget |
| 2008/0240735 A1 | 10/2008 | Bossard |
| 2019/0117166 A1 | 4/2019 | Zhang |
| 2021/0351752 A1 | 11/2021 | Halbert et al. |

OTHER PUBLICATIONS

Foreign Search Report on non-Foley case related to U.S. Appl. No. 18/139,241 dtd Sep. 20, 2024.
He Lin et al: "A CMOS Current Sensing Interface With Sub-pA DC Uncertainty", IEEE Transactions on Circuits and Systems II: Express Briefs, IEEE, USA, vol. 71, No. 2, Dec. 7, 2022 (Dec. 7, 2022), pp. 508-512, XP011959966, ISSN: 1549-7747, DOI: 10.1109/TCSII. 2022.3227733[retrieved on Dec. 8, 2022] figure 3.

*Primary Examiner* — Andrea Lindgren Baltzell
*Assistant Examiner* — Malane Lieng
(74) *Attorney, Agent, or Firm* — Foley & Lardner LLP

(57) ABSTRACT
An apparatus includes a first circuit that has a photodetector. The photodetector is reverse-biased by a reverse-bias voltage. A common mode voltage is added to the reverse-bias voltage to provide an offset to the photodetector voltage. A second circuit is coupled to the first circuit to provide the common mode voltage for the first circuit. A third circuit is coupled to the second circuit that includes a first voltage source and a second voltage source having opposite voltages equal to half of the reverse-bias voltage. Each one of the first voltage source and the second voltage source are coupled between separate input and output nodes of input and output ports of the third circuit. The first voltage source and the second voltage source provide the reverse-bias voltage to the first circuit to reverse-bias the photodetector. The third circuit provides a photodetector current at an output of the third circuit.

20 Claims, 6 Drawing Sheets

METHOD AND APPARATUS FOR INTERFERENCE REDUCTION IN OPTICAL SENSING RECEIVERS

TECHNICAL FIELD

The present description relates generally to receivers for optical sensing, including optical detectors, and in particular, to reduction of interference including radio frequency (RF) interference.

BACKGROUND

Optical sensing devices that include optical detectors are used for sensing optical signals. Optical signals may be weak and require amplification up to a hundred times or more by amplifier circuits. Electronic circuits including optical sensing devices are prone to electromagnetic interference. Thus, interference signals caused by electromagnetic interference may be added to the optical signal and amplified, up to a hundred times or more, by the amplifier circuits and contaminate the optical signals. Therefore, it is highly desirable to minimize the interference signal before being added to the optical signals and before the optical signal is amplified.

BRIEF DESCRIPTION OF THE DRAWINGS

Certain features of the subject technology are set forth in the appended claims. However, for purposes of explanation, several aspects of the subject technology are depicted in the following figures.

DETAILED DESCRIPTION

Figure 1:
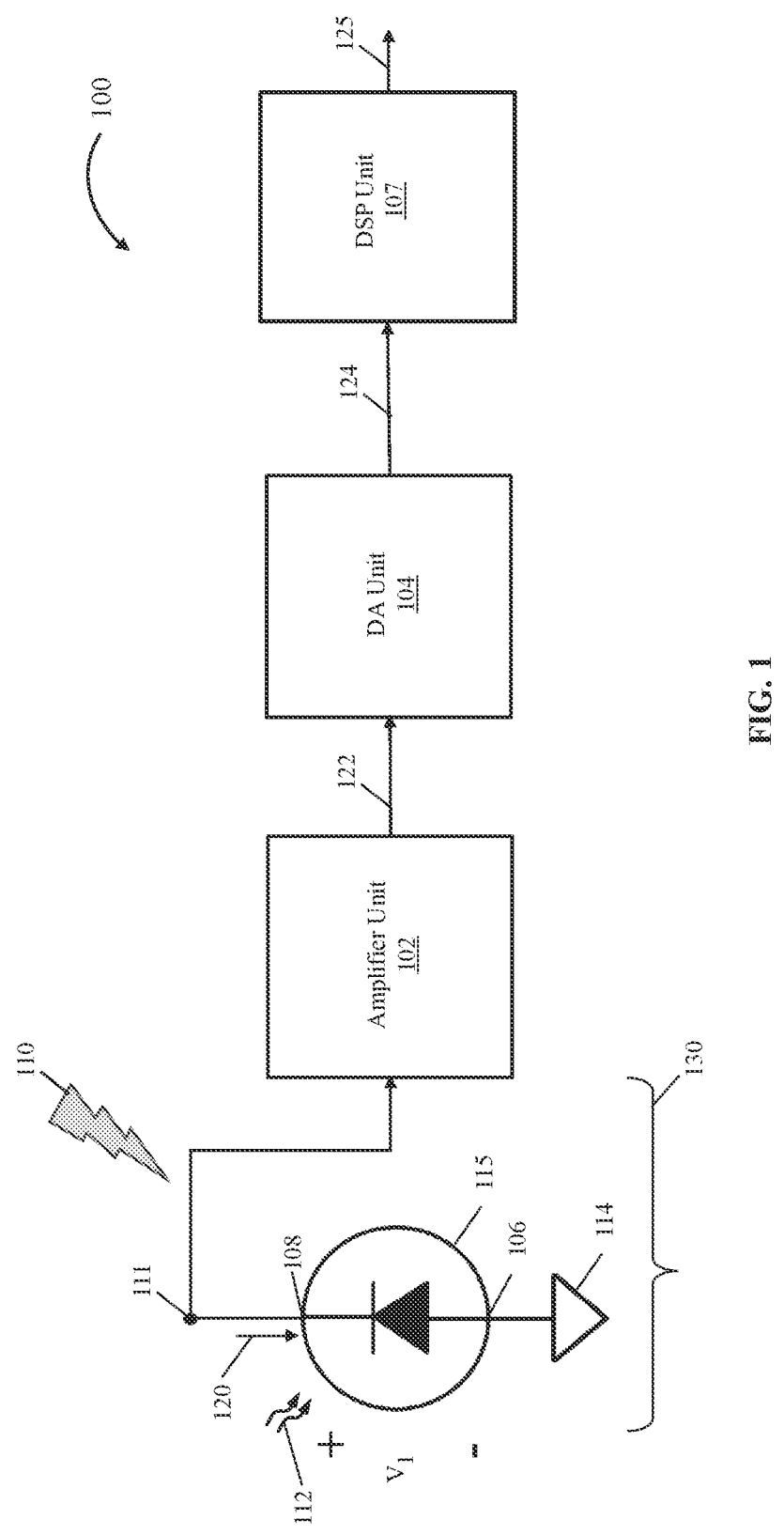
FIG. 1 illustrates an apparatus for detecting and processing optical signals.

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

A circuit for detecting optical signals may have closed loops and, thus, electromagnetic interference, e.g., radio frequency (RF) electromagnetic (EM) interference, e.g., electromagnetic signals induced by power lines and devices using alternating current, in the environment may generate currents and voltages in the closed loops of the circuit and may impact the detected signals. In some embodiments, the detected optical signals produce low currents and voltages that require considerable amplification of hundred times or more to increase the detected signal to a voltage or current level that may be digitized and then processed. Because the electromagnetic interference is added to the detected signal before amplification, the amplification may also amplify the electromagnetic interference the same way that the detected optical signal is amplified. The circuits and apparatuses introduced below provide fully differential architectures for signal paths and have a very good interference rejection because of the symmetric structure. The interference affects both signal paths (positive and negative) nearly the same, so when the negative signal is subtracted from the positive signal, the interference on both signals cancels each other. Thus, the fully differential signal paths may cause the common-mode interference (CMI) to be subtracted between positive and negative output nodes and, thus, the CMI is rejected and RF electromagnetic (EM) interference and electrostatic discharge (ESD) effects are reduced. In addition, the circuit for detecting optical signals may reverse-bias a photodetector of the circuit for detecting optical signals and also may provide a common mode voltage, e.g., an offset voltage, to increase the dynamic range and prevent non-linearity, e.g., clipping from top or bottom. In some embodiments, the fully differential signal paths opens the possibility of increasing the common mode voltage to about half the supply rails. Higher common mode voltages reduce the non-linearity produced by ESD protection circuit and EMI due to balance swing, e.g., caused by reverse-biased diodes that are used for ESD protection. In some embodiments, the optical signal is a periodic signal and the detected signal is a periodic voltage. The common mode voltage may be adjusted based on induced currents such that the detected current of the photodetector and the detected output voltage are not clipped from top or bottom. In some embodiments, the circuits, devices, and systems introduced below that provide a differential architecture, e.g., a fully differential architecture, reduces the input referred current detection error, induced by the CMI, to more than two orders of magnitude lower compared to circuits that do not have the fully differential architecture. The EMI impinging on the ESD diodes may be partially rectified by the ESD diodes out of the detector circuit 202 and partially remain and generate a current in the detector circuit 202 that is not from photo-detector, causing error in the apparatus 300.

FIG. 1 illustrates an apparatus for detecting and processing optical signals. An apparatus 100 of FIG. 1 shows a circuit 130, e.g., a circuit for detecting optical signals, which includes a photodetector 115 coupled between a voltage node 111 and a ground 114. As shown, an anode 106 of the photodetector 115 is coupled to the ground 114 and a cathode 108 of the photodetector 115 is coupled to the voltage node 111. In some embodiments, In some embodiments, a voltage V1 of the voltage node 111 is forced, e.g., induced, by the amplifier unit 102 and, thus, the photodetector 115 is reverse-biased by the voltage V1. In some embodiments, the photodetector 115 is a diode that is reverse-biased and an optical signal 112, e.g., light rays, impinge on a depletion region (not shown) of the photodetector 115 to generate charge carriers proportional to an intensity of the light rays. In some embodiments, the charged carriers are determined to be proportional to the intensity of the light rays and by increasing the intensity of the light rays by n times, where n is 2, 3, . . . , the number of charged carriers is increased by n times. The generated charge carriers, produce a current 120, e.g., an input signal, by the photodetector 115. In some embodiments, the voltage V1 is between about 0 volts and 10 volts. In some embodiments, in a reverse-biased diode a voltage coupled to the cathode of the diode is higher than the voltage coupled to an anode of the diode. In some embodiments, the photodetector 115 is a diode that is reverse-biased.

As shown in FIG. 1, the apparatus 100 also includes an amplifier unit 102, a data acquisition unit, e.g., a DA unit 104, and a digital signal processing unit, e.g., a DSP unit 107. The current 120 or a voltage generated by the current 120 and proportional to the current 120 is amplified by the amplifier unit 102. In some embodiments, the amplifier unit 102 amplifies the input signal several folds, e.g., a hundred times or more, to produce an output signal 122, e.g., a voltage, which is used by the DA unit 104.

As shown in FIG. 1, in some embodiments, an EM interference (EMI), e.g., EMI 110, is present in an environment of the circuit 130 of the apparatus 100. The EMI 110 may induce an interference current in the circuit 130 that is amplified along with the current 120 and is similarly added, as an interference signal, to the output signal of the amplifier unit 102 and, thus, the output signal 122 includes interference signal. The output signal 122 of the amplifier unit 102 is received by the DA unit 104, as an input signal, to produce an output signal 124 of the DA unit 104. In some embodiments, the DA unit 104 digitizes, by an analog to digital converter (not shown), the input signal and, thus, the output signal 124 is a digitized form of the output signal 122. The output signal 124 is then fed into the DSP unit 107 for processing and to generate an output signal 125.

Figure 2:
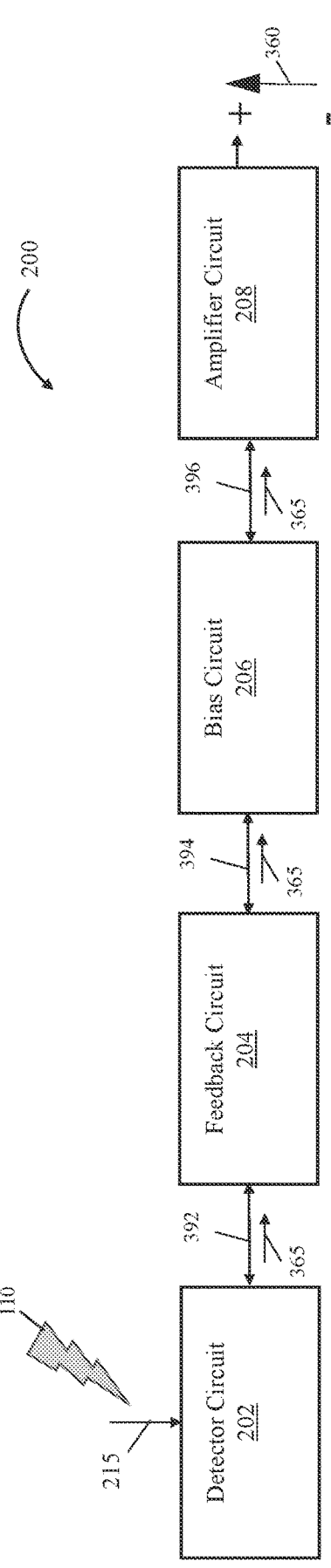
FIG. 2 illustrates an apparatus for detecting optical signals, according to various aspects of the subject technology.

FIG. 2 illustrates an apparatus for detecting optical signals, according to various aspects of the subject technology. In some embodiments, an apparatus 200 of FIG. 2 shows is a combination of the circuit 130 and the amplifier unit 102 of FIG. 1. As shown, the apparatus 200 includes a detector circuit 202 that includes the photodetector 115. The apparatus 200 also includes a feedback circuit 204, a bias circuit 206, and an amplifier circuit 208 that generates an output, e.g., an output voltage 360. The detector circuit 202 is coupled to the feedback circuit 204 through an interface 392. The feedback circuit 204 is coupled to the bias circuit 206 through an interface 394 and the bias circuit 206 is coupled the amplifier circuit 208 through an interface 396. The interfaces 392, 394, and 396 are used to coupled voltages and transfer current, at either direction, between the circuits at both sides of the interfaces 392, 394, and 396. The detector circuit 202, the feedback circuit 204, the bias circuit 206, the amplifier circuit 208, and the interfaces 392, 394, and 396 are described in more details below with respect to FIGS. 3A, 3B, and 3C. FIG. 2 also shows that the EMI 110 may affect the detector circuit 202 and may generate an EMI current, e.g., a current 215, in the detector circuit 202. In some embodiments, the feedback circuit 204 is used to filter the EMI and prevents the EMI, e.g., the EMI outside the frequency band of the optical signal 112, from reaching the amplifier circuit 208 coupled to the bias circuit 206. In some embodiments, the amplifier circuit 208 receives a current 363 via the feedback circuit 204 and the bias circuit 206. In some embodiments, the resistors 316, 318, 336, and 338 have large resistance, e.g., more than one mega ohm and also the capacitors 322, 324, 332, and 334 are charged such that a sum of the currents through the resistors 316, 318, 336, and 338, and the currents through the capacitors 322, 324, 332, and 334 is negligible. Thus, the current 363 is almost the same as, e.g., within one percent difference of, a photodetector current 365. Thus, in some embodiments, the amplifier circuit 208 amplifies the photodetector current 365 to provide the output voltage 360 that is proportional to the photodetector current 365. In some embodiments, the output voltage 360 is determined to be proportional to the photodetector current 365 and by increasing the photodetector current 365 by n (e.g., n=2, 3, etc.) times, the output voltage 360 is also increased by n times. In some embodiments, the currents through the resistors 316, 318, 336, and 338 is not negligible and adds a current bias is added to the photodetector current 365 and the current 363 is the photodetector current 365 plus a current bias. When the amplifier circuit 208 amplifies the current 363, an output voltage 360 may be provided that is proportional to the photodetector current 365 plus a voltage bias such that the voltage bias may limit a dynamic range of the output voltage 360.

In some embodiments, by receiving a voltage at an interface coupled between two circuits, e.g., between circuit-A and circuit-B, the circuit-A provides, e.g., delivers, the voltage at the interface and the circuit-B receives the voltage at the interface. Thus, in some embodiments, the interface is an output port of the circuit-A and also is an input port of the circuit-B. Also, in some embodiments, the output port of the circuit-A and the input port of the circuit-B are coupled through two nodes, e.g., node-1 and node-2. In some embodiments, by receiving a current at the interface coupled between circuit-A and circuit-B, the circuit-A provides, e.g., delivers, the current at the node-1 of the interface and the circuit-B receives the current at the node-1 of the interface.

Figure 3A:
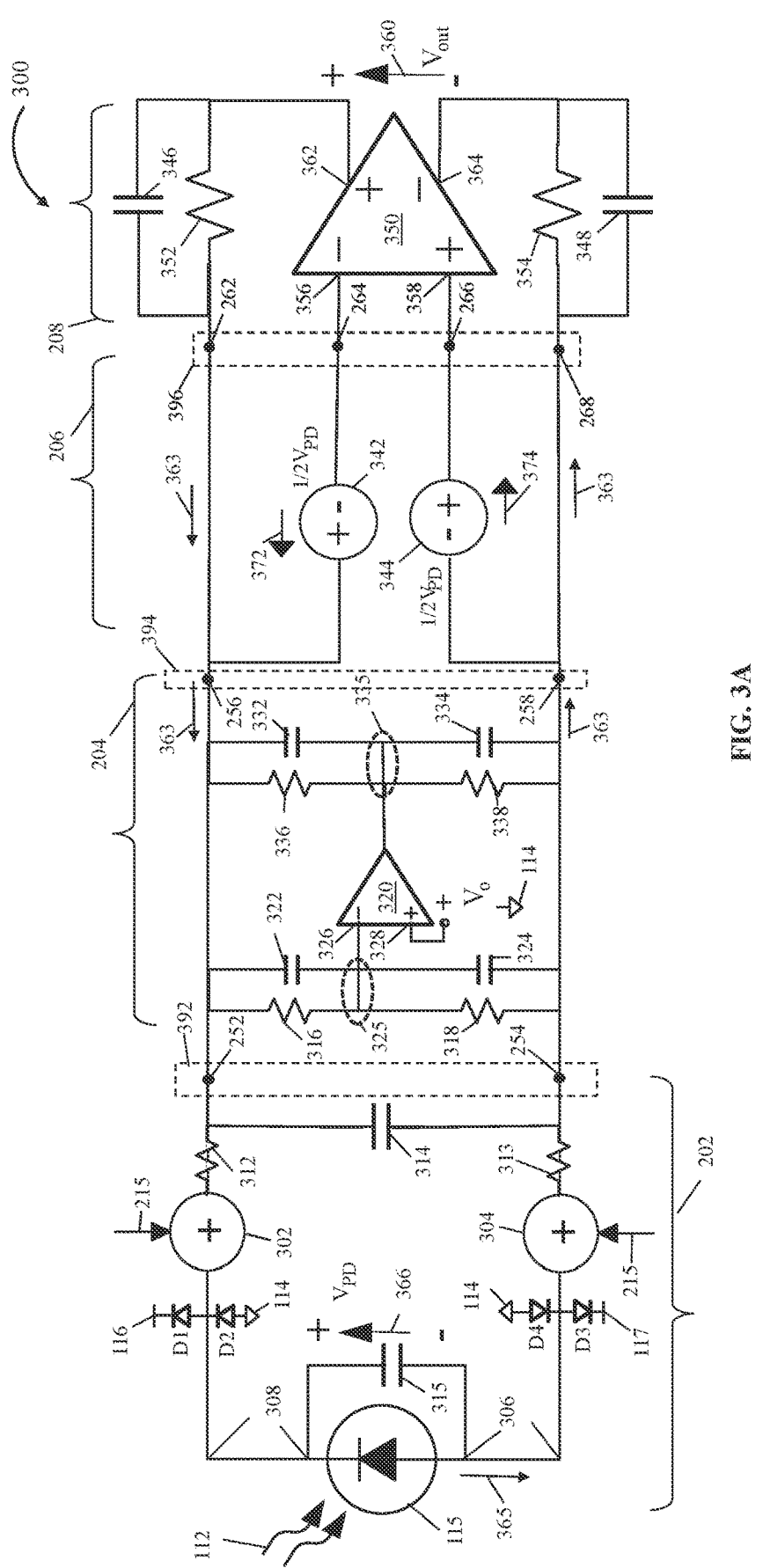
FIGS. 3A, 3B, and 3C illustrate an apparatus for detecting optical signals, an apparatus for detecting optical signals and with protection against electrostatic discharge, and a circuit for reverse-biasing a photodetector, according to various aspects of the subject technology.
Figure 3B:
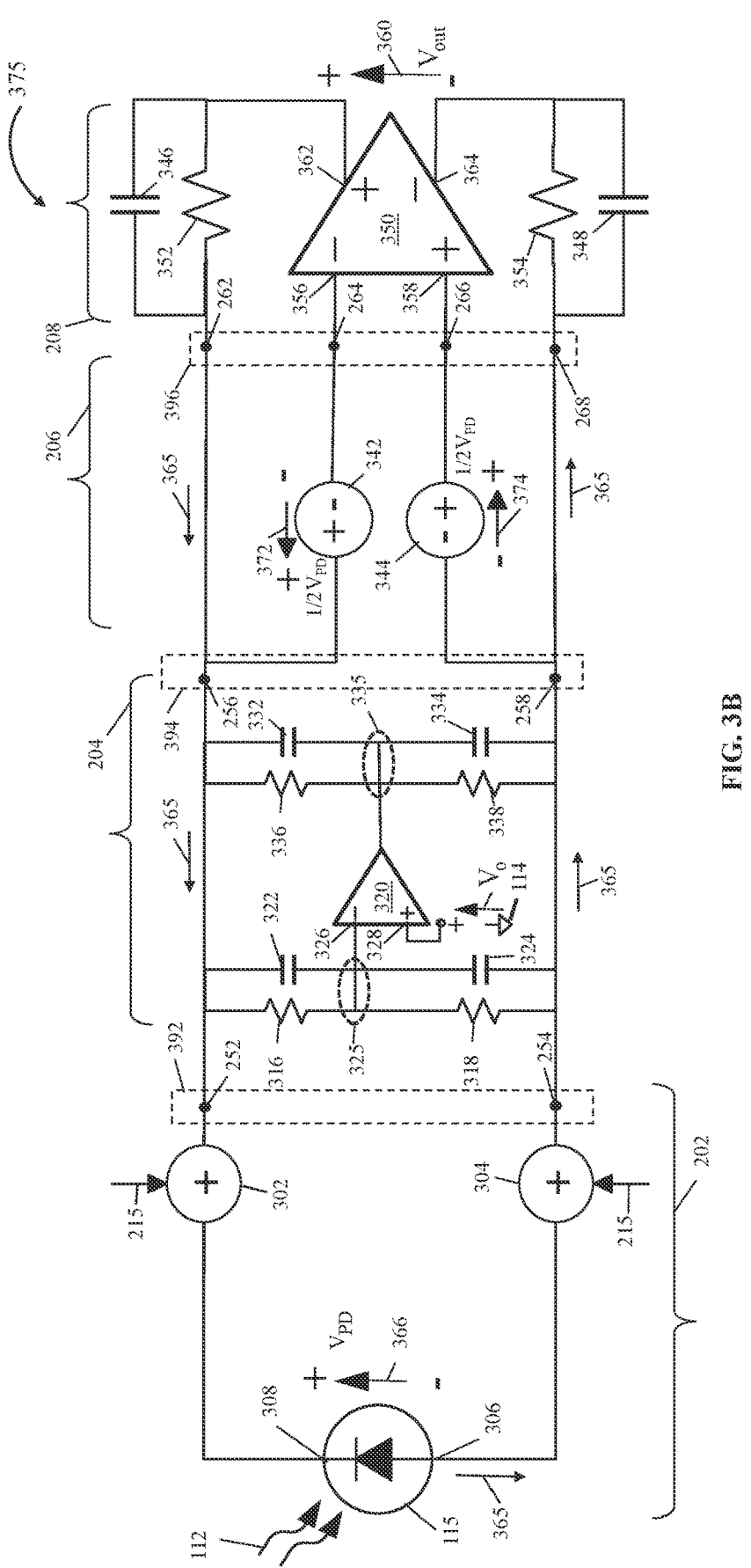
Figure 3C:
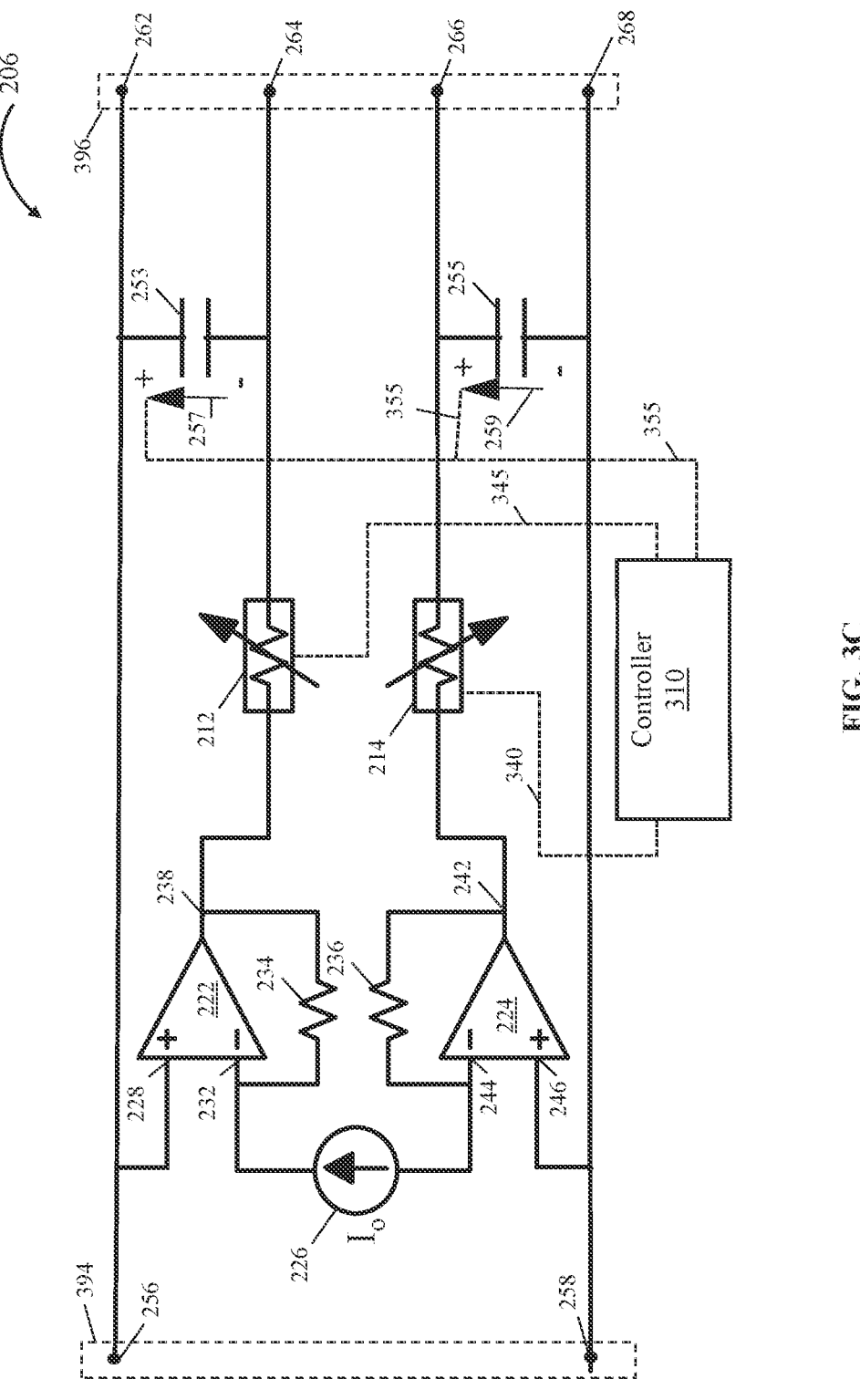

FIGS. 3A, 3B, and 3C illustrate apparatuses for detecting optical signals and a circuit for reverse-biasing a photodetector, according to various aspects of the subject technology. FIG. 3A shows the apparatus 300 for detecting optical signals 112 that impinge on the photodetector 115. In some embodiments, the optical signal are optical pulses that are detected by the photodetector 115. In some embodiments, as described, the photodetector 115 is reverse-biased and, thus, a voltage between both ends of the photodetector 115, which is between a cathode 308 and an anode 306 of the photodetector 115, is a positive voltage. In some embodiments, as noted above, a voltage 366, e.g., a reverse-bias voltage $V_{PD}$ of the photodetector 115 is between about 0 volts and about 10 volts. In some embodiments, the reverse-bias voltage $V_{PD}$ is applied in a symmetrical form such that half of the reverse-bias voltage, which is $\frac{1}{2}V_{PD}$ is applied to the cathode 308 and $-\frac{1}{2}V_{PD}$ is applied to the anode 306.

In some embodiments, as shown, a capacitor 315 is coupled in parallel with the photodetector 115. As shown, in response to the optical signal 112 impinging on the photodetector 115, a photodetector current 365 is generated by the photodetector 115 in the detector circuit 202, e.g., a first circuit. In some embodiments, the capacitor 315 is used to cause a short-circuit parallel to the photodetector 115 for the current and/or voltage fluctuations, e.g., high frequency fluctuations, and prevent the fluctuation to impact the photodetector 115. In some embodiments, ground bouncing interference to the photodetector 115 is absorbed by the capacitor 315 and the fully differential structure of the apparatus 300 is maintained.

The detector circuit 202 is further coupled to a first group of ESD diodes D1 and D2 and to a second group of ESD diodes D3 and D4. The diode D1 is coupled and reverse-biased between the cathode 308 and the voltage node 116, which has a positive voltage between about 2 volts and 5 volts above the voltage of the cathode 308. The diode D2 is coupled and reverse-biased between the cathode 308 and the ground 114. In some embodiments, the diodes D1 and D2 are reverse-biased diodes that are used for preventing a damage to the apparatus 300 because of the electrostatic discharge (ESD). In some embodiments, the diodes D1 and D2 transfer at least a part of the ESD, out of the detector circuit 202. Similarly, in some embodiments, the diode D3 is coupled and reverse-biased between the anode 306 and a voltage node 117, which has a positive voltage between about 2 volts and 5 volts above the voltage of the anode 306. The diode D4 is coupled and reverse-biased between the anode 306 and the ground 114. In some embodiments, the reverse-biased diodes D1 and D2 are coupled to the detector circuit 202 and adjacent to the cathode 308, and also reverse-biased diodes D3 and D4 are coupled to the detector circuit 202 and adjacent to the anode 306 and are used for preventing a damage to circuit components of the apparatus 300 due to electrostatic discharge (ESD) and transferring the ESD, e.g., at least part of the ESD, out of the detector circuit 202. The EMI induced on the detector circuit may be rectified by the ESD diodes and because of the non-linearity of the ESD diodes may cause a current in the detector circuit 202, which is not from photodetector, causing error in the apparatus 300. In some embodiments, the symmetrical configuration of the first and second groups of diodes helps balance the non-linearity on inverting node 326 and non-inverting node 328 of an operational-amplifier, Op-Amp 320, of the feedback circuit 204.

In addition to the ESD, as described above, the detector circuit 202 may be affected by the EMI from a power line, a neighboring device or circuit, and as shown in FIG. 1, the EMI 110 may generate an additional current, the current 215 in the detector circuit 202 such that the current 215 is added to the photodetector current 365 of the photodetector 115. Although, the current 215 is induced in the detector circuit 202, because the apparatus 300 provides fully differential signal paths, FIG. 3A shows that the addition of current 215, which is induced may conceptually be represented by the addition modules 302 and 304. Similar to the current caused by the ESD diodes, in some embodiments, the current 215 is applied as common mode to the apparatus 300 and is rejected, e.g., removed, by the fully differential structure of the apparatus 300. In some embodiments, the current 215 includes the current caused by the non-linearity of the ESD diodes as described before. In some embodiments, the first group of ESD diodes are physically close to about half of the source of the ESD and the second group of ESD diodes are physically close to another half of the source of the ESD. In some embodiments, a combination of the feedback circuit 204, the bias circuit 206, and the amplifier circuit 208 provides the fully differential signal paths.

As shown in FIG. 3A, the detector circuit 202 is connected to feedback circuit 204 through the interface 392 at an output of the detector circuit 202 and an input of the feedback circuit 204, which provides the common mode voltage for the reverse-biased photodetector 115. The interface 392 includes the two nodes 252 and 254, e.g., connection nodes, and voltages or currents are shared or transferred through the two nodes 252 and 254. The feedback circuit 204 includes a first RC circuit that includes a resistor 316, e.g., a first resistor, and a resistor 318, e.g., a second resistor coupled, in series, coupled to the interface 392 between the nodes 252 and 254. The first RC circuit further includes a capacitor 322, e.g., a first capacitor, and a capacitor 324, e.g., a second capacitor coupled to the interface 392 between the nodes 252 and 254. In some embodiments, as shown, a midpoint between the resistor 316 and the resistor 318 and the midpoint between the capacitor 322 and the capacitor 324 are connected to each other to provide a junction point 325, e.g., a first junction point or a first node. In some embodiments, the interface 392 is an output port of the detector circuit 202 and is an input port of the feedback circuit 204. In some embodiments, the interfaces 392, 394, or 396 is either an input port or an output port or both based on the circuits coupled to the interfaces 392, 394, or 396.

In addition, the capacitor 322 is coupled in parallel with the resistor 316 between the node 252 and the junction point 325 and the capacitor 324 is coupled in parallel with the resistor 318 between the junction point 325 and the node 254. In some embodiments, values of the resistor 316 and the resistor 318 and the values of the capacitor 322 and the capacitor 324 are selected such that the values do not affect the photodetector signal being processed. Also, the high frequency noise and interferences outside a frequency band of the optical signal 112 are short circuited by the capacitor 322 and the capacitor 324 and do not move from the detector circuit 202 beyond the feedback circuit 204. In some embodiments, as shown in FIG. 3A, the detector circuit 202 of the apparatus 300 also includes an RC filter, e.g., a low-pass filter, coupled to the interface 392. As shown, a capacitor 314 of the RC filter is coupled between the nodes 252 and 254 and resistors 312 and 313 are coupled between the nodes 252 and 254 and the addition modules 302 and 304, respectively. In some embodiments, the resistors 312 and 313 have values such that the fully differential structure of the apparatus 300 is maintained, e.g., have same values. In some embodiments, the low-pass RC filter is designed and the capacitor 314 and the resistors 312 and 313 are selected for filtering the EMI from the ESD and other unwanted signals that are outside the frequency band of the optical signal 112.

The feedback circuit 204 is connected to the bias circuit 206 through the interface 394 at an output of the feedback circuit 204 and an input of the bias circuit 206. The feedback circuit 204 includes a second RC circuit that includes a resistor 336, e.g., a first resistor of the second RC circuit, and a resistor 338, e.g., a second resistor, of the second RC circuit coupled, in series, to the interface 394 between the two nodes 256 and 258 of the interface 394. Similarly, voltages or currents are shared or transferred through the nodes 256 and 258 between the feedback circuit 204 and the bias circuit 206. In addition, a capacitor 332, e.g., a first capacitor of the second RC circuit, is coupled in parallel with the resistor 336 between the node 256 and a junction point 335, e.g., a second junction point or a second node, and a capacitor 334, e.g., a second capacitor of the second RC circuit, is coupled in parallel with the resistor 338 between the junction point 335 and the node 258. In some embodiments, the resistor 336 and the resistor 338 have the same value, which is similar to the value of the resistor 316 or the resistor 318 of the first RC circuit. In some embodiments, the capacitor 332 and the capacitor 334 have the same value, which is similar to the value of the capacitor 322 or the capacitor 324 of the first RC circuit.

As shown in FIG. 3A, the feedback circuit 204 further includes the Op-Amp 320, such that an inverting node 326 of the Op-Amp 320 is connected to the junction point 325 and an output node of the Op-Amp 320 is connected to the junction point 335. Also, the common mode voltage $V_o$ (e.g., the offset voltage) is coupled between a non-inverting node 328 of the Op-Amp 320 and the ground 114. As noted above, the bias circuit 206 is connected to the feedback circuit 204 through the interface 394 described above. The bias circuit 206 includes voltage sources 342 and 344, e.g., sources for providing separate voltages, which provide voltages $+\frac{1}{2}$ $V_{PD}$ and $-\frac{1}{2}V_{PD}$, e.g., about the same voltage value with opposite signs, where $V_{PD}$ is a voltage of the photodetector 115. In some embodiments, $V_{PD}$ is the same as a reverse-bias voltage $V_{RB}$ of the photodetector 115 between the cathode 308 and the anode 306 of the photodetector 115. Thus, in some embodiments, the voltage sources 342 and 344 have about the same value equal to half of the reverse-bias voltage with opposite signs. In some embodiments, the voltage sources 342 and 344 are not physical voltage sources but rather are produced by one or more electronic circuits as described with respect to FIG. 3C. In some embodiments, the Op-Amp 320 works, e.g., is biased, in the linear region and the voltage of the inverting node 326 and the voltage of the non-inverting node 328 are equal. In some embodiments, a voltage source 342 provides a voltage 372 for the cathode 308 and a voltage source 344 provides a voltage 374 for the anode 306. In some embodiments, the common mode voltage $V_o$ and the photodetector 115 voltage $V_{PD}$ at each cathode 308 or anode 306 may independently change. In some embodiments, the common mode voltage $V_o$ changes between 0.5 volts and 10 volts and the photodetector 115 voltage $V_{PD}$ changes between zero volts and 10 volts.

In some embodiments, the common mode voltage $V_o$, e.g., about the same voltage, is added to the voltage of the cathode 308 and the anode 306 of the photodetector 115 and the sum voltage is applied to the cathode 308 and the anode 306. Thus, a voltage $V_A$ of the anode 306 and a voltage $V_C$ of the cathode 308 may respectively be presented by equations (1) and (2).

$$V_A = V_o - 1/2V_{PD} \qquad \text{Eq (1)}$$

$$V_C = V_o + 1/2V_{PD} \qquad \text{Eq (2)}$$

Thus, the common mode voltage $V_o$ is applied as a common offset to both anode 306 and the cathode 308 and the voltage across the photodetector 115 is $V_{PD}$. The voltage $V_o$ or $V_{PD}$ in equations (1) or (2) may independently change by up to ten folds and still the voltage of the anode 306 and the voltage of the cathode 308 may be represented by equations (1) and (2) with modified common mode and photodetector voltages. The apparatus 300 will provide the fully differential paths, if the modified common mode and photodetector voltages are within an acceptable range. In some embodiments, an output voltage of the Op-Amp 320 is proportional to the voltage of the non-inverting node 328 minus the voltage of the inverting node 326. Thus, the voltage of the inverting node 326 is multiplied by negative one and then is added to the voltage of the non-inverting node 328. In some embodiments, in the linear region, the Op-Amp 320 has a gain K between a thousand and ten thousand such that the output voltage of Op-Amp 320 is K times the input voltage, which is the voltage difference between the non-inverting node 328 and the inverting node 326. Since the output voltage of the Op-Amp 320 is limited by the voltage sources of the Op-Amp 320 that are about 2 to 15 volts, the input voltage of the Op-Amp 320 is very small and about zero volts. Therefore, when the Op-Amp 320 operates in the linear region, the non-inverting and inverting nodes 328 and 326 of the Op-Amp 320 may be assumed to have the same voltage. In some embodiments, as shown by equations (1) and (2), the common mode voltage $V_o$ is an offset voltage to both the anode 306 and the cathode 308.

As shown, the apparatus 300 also includes the amplifier circuit 208 that is coupled to the bias circuit 206 through the interface 396 and via nodes 262, 264, 266, and 268 of the interface 396. The voltage source 342, e.g., a first voltage source, is coupled between the node 264 and the node 256 and supplies a voltage 372, which is $\frac{1}{2}V_{PD}$. The voltage source 344, e.g., a second voltage source, is coupled between the node 266 and the node 258 and supplies a voltage 374, in an opposite direction of the voltage 372, which is $\frac{1}{2}V_{PD}$.

As noted above, the amplifier circuit 208 is coupled to the bias circuit 206 via the interface 396 and through the nodes 262, 264, 266, and 268 of the interface 396. The amplifier circuit 208 includes an Op-Amp 350 with a non-inverting node 358 coupled to the node 266 and an inverting node 356 coupled to the node 264. The Op-Amp 350 includes a positive output node 362 and a negative output node 364. A resistor 352 and a capacitor 346 are coupled in parallel between the positive output node 362 and the node 262 of the interface 396. Also, a resistor 354 and a capacitor 348 are coupled in parallel between negative output node 364 and the node 268 of the interface 396.

Because the apparatus 300 provides fully differential signal paths, values of the capacitors 346 and 348 are selected based on the bandwidth of the apparatus 300. Also, the resistors 352 and 354 have the same values and are selected based on a required gain of the amplifier circuit 208. As shown, in some embodiments, a voltage between the positive output node 362 and the negative output node 364 of the Op-Amp 350 is an output voltage 360 (Vout) of the apparatus 300. In some embodiments, the Op-Amp 350 works, e.g., is biased, in the linear region of an Op-Amp and, thus, the voltage of the inverting node 356 is equal to the voltage of the non-inverting node 358. Therefore, the sum of the voltages of the voltage source 342 and the voltage source 344 will be applied on the photodetector 115 and the voltage 366 is equal to the sum of the voltages of the voltage source 342 and the voltage source 344, which is the voltage $V_{PD}$ and is the reverse-bias voltage $V_{RB}$ of the photodetector 115.

FIG. 3B shows an apparatus 375 for detecting optical signals. The apparatus 375 is the same as apparatus 300 with only difference that the apparatus 375 does not show the extra circuitry for transferring the ESD out of the detector circuit 202. does not show the capacitor 315, and does not show the RC filter coupled to the interface 392. The apparatus 375 includes the detector circuit 202 producing the photodetector current 365 and the current 363 that circulates in the apparatus 375. The apparatus 375 also includes the feedback circuit 204 having the Op-Amp 320 with the inverting node 326 coupled to the junction point 325, a voltage source, e.g. a common mode voltage reference, providing the common mode voltage $V_o$ is applied to the non-inverting node 328, and an output node of the Op-Amp 320 is coupled to the junction point 335. The apparatus 375 includes the amplifier circuit 208, which includes the Op-Amp 350 that works, e.g., is biased, in the linear region and, thus, the voltages of the non-inverting node 358 and the inverting node 356 are the same.

FIG. 3C shows a circuit, e.g., a bias circuit 206, for reverse-biasing the photodetector 115. In some embodiments, the bias circuit 206 of FIG. 3C provides the voltage sources 342 and 344. The bias circuit 206 of FIG. 3C, which can be used as part of the apparatus 300, shows the interface 394, having the nodes 256 and 258, and the interface 396, having the nodes 262, 264, 266, and 268. As shown the bias circuit 206 of FIG. 3C includes two operational-amplifiers, an Op-Amp 222, e.g., a first Op-Amp, and an Op-Amp 224, e.g. a second Op-Amp. Non-inverting nodes 228 and 246 of the Op-Amps 222 and 224 are respectively coupled to the nodes 256 and 258. In addition, the nodes 256 is coupled to the node 262 and the node 258 is coupled to the node 268. As shown, a current source 226 providing a current $I_o$ is coupled between the inverting node 232 of the Op-Amp 222 and the inverting node 244 of the Op-Amp 224. A resistor 234, e.g., a first resistor, is coupled between the inverting node 232 and an output node 238 of the Op-Amp 222 and a resistor 236, e.g., a second resistor, is coupled between the inverting node 244 and an output node 242 of the Op-Amp 224. As shown, a resistor 212 and a resistor 214 are respectively coupled between the output node 238 of the Op-Amp 222 and the node 264, and coupled between the output node 242 of the Op-Amp 224 and the node 266. In some embodiments, the resistors 212 and 214 are variable resistors. Capacitors 253 and 255 are respectively coupled between the nodes 262 and 264 and between the nodes 266 and 268. In some embodiments, the RC time constant of the resistor 212/214 and the capacitor 253/255 is long enough to filter out any low frequency noise from Op-Amp 222 and Op-Amp 224, resistor 234/236 and current source 226.

In some embodiments, as shown, the bias circuit 206 includes a controller 310 that is coupled via control lines 340 and 345, e.g., connection lines, to the resistor 212 and the resistor 214, respectively, to control a value of resistor 212 and the resistor 214. In some embodiments, the current $I_o$ of the current source 226 and the feedback resistor 234/236 crossing the Op-Amp 222 and the Op-Amp 224 builds a reverse-bias voltage and charges it to the capacitor 253 and 255 that produce voltages 257 and 259, respectively. In some embodiments, the capacitors 253 and 255 are charged to a half of the reverse-bias voltage. In some embodiments, the values of the resistors 234 and 236 and capacitors 253 and 255 are selected to be the same and the Op-Amps 222 and 224 have the same operating parameters. In some embodiments, the voltages produced by the stored charges on the capacitors 253 and 255 have different magnitudes of up to twenty percent, however, the sum of the magnitude of the voltages 257 and 259 makes the photodetector 115 reverse-biased. In some embodiments, the voltage 257 is consistent with the voltage 372 and the voltage 259 is consistent with the voltage 374.

The controller 310 adjusts the resistor 212 and the resistor 214 such that the time constant of charging the capacitors 253 and 255 are adjusted. In some embodiments, the voltages 257 and 259 of the capacitors 253 and 255 are determined by the current $I_o$ of the current source 226 and the feedback resistor 234/236 crossing the Op-Amp 222 and the Op-Amp 224. In some embodiments, the resistor 212 and resistor 214 are implemented with field effect transistors (FET). In some embodiments, the resistor 212 and resistor 214 are metal oxide semiconductor field effect transistors (MOSFET) that are biased in the weak inversion regions and the controller 310 adjusts the gate voltage of the FET or MOSFET, through the control lines 340 and 345, to change the resistance between drain and source of the transistor ($R_{ds}$). In some embodiments, by biasing the transistors in the weak inversion region, a large resistance can be achieved using an small chip area. In some embodiments, increasing the resistance of the resistors 212 and 214 reduces in-band thermal noise. In some embodiments, the controller 310 senses the voltages 257 and 259, through the control line 355, and adjusts the resistor 212 and the resistor 214 to adjust the time constant of charging the capacitors 253 and 255 to reduce low frequency noise of the voltages 257 and 259. In some embodiments, the recharging of the capacitors 253 and 255, due to charge leakage of the capacitors 253 and 255, is performed continuously and even when the apparatus 300 is detecting optical signals 112 and do not need to stop the detection.

Figures 4A, 4B:
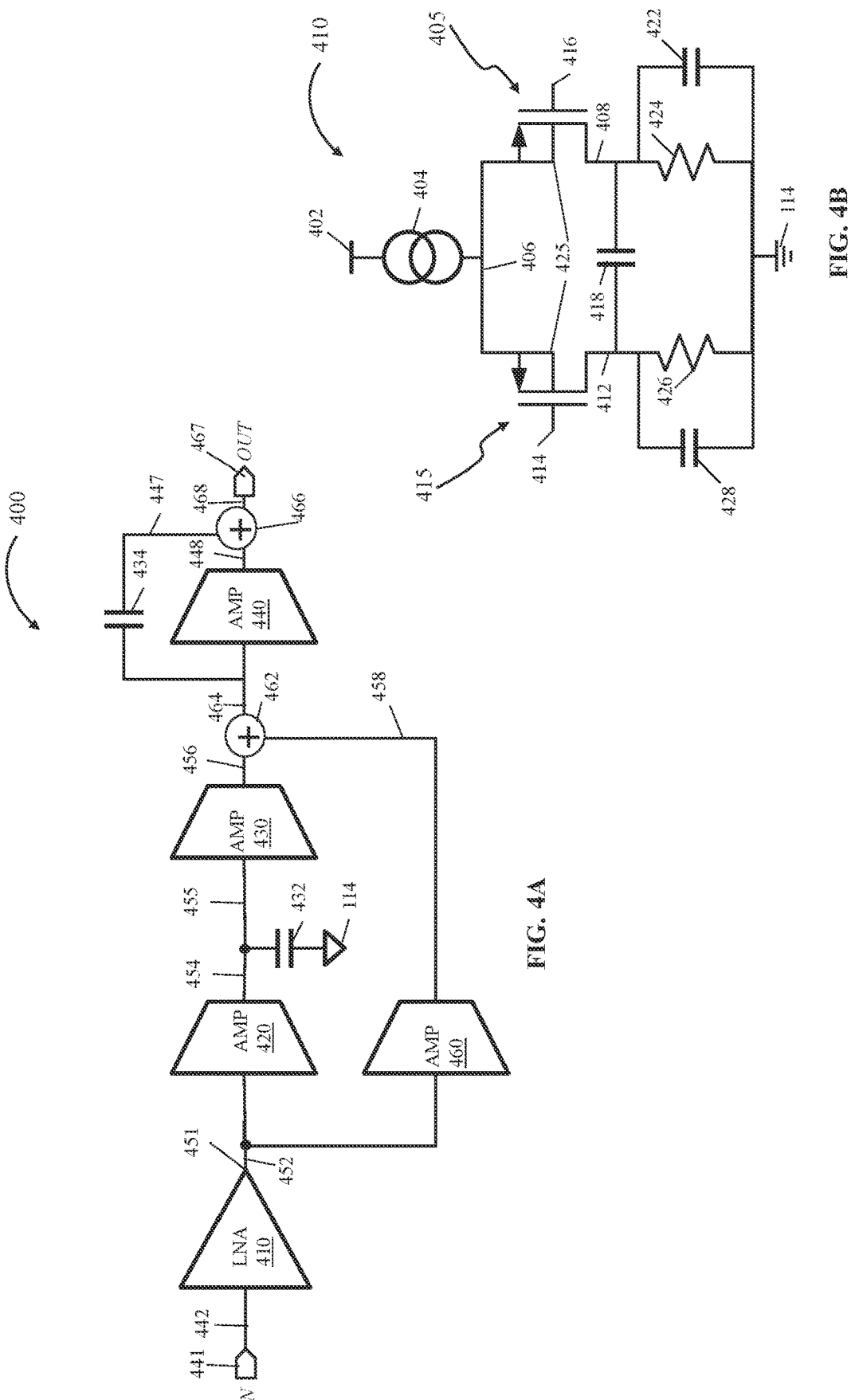
FIGS. 4A and 4B illustrate an amplifier circuit and a low noise amplifier circuit for the apparatus for detecting optical signals, according to various aspects of the subject technology.

FIGS. 4A and 4B illustrate an amplifier circuit and a low noise amplifier circuit for the system for detecting optical signals, according to various aspects of the subject technology. FIG. 4A shows the amplifier circuit 400 that includes multiple stages and first stage that is a low noise amplifier (LNA). The amplifier circuit 400 may replace the Op-Amp 350 of FIGS. 3A, 3B, and 3C. As a first stage, the amplifier circuit 400 includes the LNA, e.g., an LNA 410, which receives the input signal 442. In some embodiments, the input signal 442 is the photodetector current 365 of the photodetector 115. The LNA 410 is a resistive loaded amplifier. The resistor load has better linearity against EMI interference compared to transistors and also has a better low-frequency noise performance, as resistor has much lower flicker noise compared to transistors. However, this structure requires a higher input common mode voltage in order to achieve similar gain and thermal noise performance compared to a transistor load used in traditional amplifier structure. The higher input common mode is provided by the fully differential architecture discussed above. And as the LNA 410 provides enough gain, it may suppress the EMI interference and noise from going to the subsequent stages.

A first output signal 452 at an output node 451 of the LNA 410 may be amplified by a dual-path three-stage amplifier composed of a first amplifier 420, a second amplifier 430, a feed forward amplifier 460 and a third amplifier 440 in some embodiments. The feed forward amplifier 460 that may amplify a wide band signal is used to amplify the first output signal 452 and to generate a second output signal 458. The first amplifier 420 receives the first output signal 452 and generates a third output signal 454. The third output signal 454 is filtered by a first capacitor 432, coupled between an output of the first amplifier 420 and a ground, to generate a fourth output signal 455. The second amplifier 430 receives the fourth output signal 455 and generates a fifth output signal 456. The fifth output signal 456 is added to the second output signal 458 by an adder module 462 to generate a signal 464. The third amplifier 440 receives the signal 464 and generates a sixth output signal 448 that is added, by an adder module 466, to the signal 447, which is the signal 464 that is filtered by a second compensation capacitor 434 that is in parallel with the third amplifier 440. The adder module 466 produces as an output signal 468 at an output node 467 of the amplifier circuit 400. In some embodiments, the first capacitor 432 is used for frequency compensation of an Op-Amp of the amplifier circuit 400.

FIG. 4B shows the LNA 410 that includes two p-type metal oxide semiconductor transistors, PMOS transistors 405 and 415. As shown, bulks of PMOS transistors 405 and 415 are coupled, via connection 425, to a common source node 406 of the PMOS transistors 405 and 415. Drains 408 and 412 of the PMOS transistors 405 and 415 are coupled, via a capacitor 418 together. In some embodiments, FIG. 4A is single ended, but in some other embodiments it is differential. FIG. 4B shows the differential implementation of the LNA 410 whereby the gates 414 and 416 of the PMOS transistors 415 and 405 that correspond to a differential version of node 441 in FIG. 4A. In some embodiments, as shown, the common source node 406 is coupled to a current source 404 and the current source 404 is coupled to a voltage node 402.

The LNA 410 further includes two RC circuits coupled in parallel. A first RC circuit includes a resistor 426 coupled in parallel to a capacitor 428. A second RC circuit includes a resistor 424 coupled in parallel to a capacitor 422. Each one of the two RC circuits are coupled between the ground 114 and each end of the capacitor 418. As noted, LNA 410 includes the resistors 424 and 426 and, thus, generate thermal noise. In some embodiments, the output of the LNA is a voltage between the drains 408 and 412 of the PMOS transistors 405 and 415, which is a differential version of output node 451 in FIG. 4A. Higher resistance of the resistors 424 and 426 may lead to lower input-referred noise of the LNA 410 and the amplifier circuit 400 and better noise performance of the amplifier circuit 400. In some embodiments, the capacitors 428 and 422 provide a bypass for the EMI to the ground 114 and the capacitor 418 provides a bypass to balance a differential EMI.

The subject technology discussed above provides a circuit for detecting an optical signal by using a photodetector. The circuit is designed to provide the fully differential signal paths and an input common-mode feedback such that input CMI rejection is achieved. Also, a bias circuitry creates a differential voltage at circuit input to provide reverse-bias for a photodetector. The circuit uses capacitors that are charged continuously to provide the reverse bias of the photodetector while the circuit is detecting optical signals. Thus, the detection does not need to stop for re-charging capacitors.

According to aspects of the subject technology, an apparatus includes a photodetector and the photodetector is reverse-biased by a reverse-bias voltage ($V_{RB}$). Also, a common mode voltage ($V_o$) is added to the reverse-bias voltage to provide an offset to both an anode and a cathode of the photodetector. The apparatus also includes a first circuit coupled to the photodetector to provide the common mode voltage to the photodetector and a second circuit coupled to the first circuit that includes a first voltage source and a second voltage source that provide the reverse-bias voltage for the photodetector. Each one of the first voltage source and the second voltage source are coupled to one of the anode or the cathode of the photodetector. The second circuit receives a current of the photodetector via the first circuit and provides the current of the photodetector at an output of the second circuit.

In an aspect of the subject technology, the first circuit includes a third voltage source to generate the common mode voltage. In an aspect of the subject technology, the first circuit includes an operational-amplifier (Op-Amp) such that an inverting node of the Op-Amp is coupled to a first node between first and second capacitors of the first circuit and an output node of the Op-Amp is coupled to a second node between third and fourth capacitors of the first circuit. The third voltage source is coupled between a non-inverting node of the Op-Amp and a ground to provide the common mode voltage to the non-inverting node of the Op-Amp. In an aspect of the subject technology, the apparatus further includes a third circuit that include a low noise amplifier and is coupled to the second circuit to amplify the current of the photodetector, received from the photodetector via the first circuit and the second circuit and to provide an output voltage proportional to the current of the photodetector. In an aspect of the subject technology, the first, second, and third circuits provide differential signal paths. In an aspect of the subject technology, the second circuit provides the reverse-bias voltage, via the first circuit to the photodetector. The second circuit receives the current of the photodetector via the first circuit. In an aspect of the subject technology, voltages at the cathode and the anode of the photodetector are set at $V_o+\frac{1}{2}V_{RB}$ and $V_o-\frac{1}{2}V_{RB}$ respectively.

According to aspects of the subject technology, an apparatus includes a first circuit that includes a first port, a second port, and a third voltage source to provide a common mode voltage ($V_o$). The first circuit receives a current at the first port, receives first and second bias voltages having opposite polarities at first and second nodes of the second port and the common mode voltage is added to the first and second bias voltages as an offset, and provides the first bias voltage plus the common mode voltage and the second bias voltage plus the common mode voltage at the first and second nodes of the first port. The apparatus also includes a second circuit, coupled to the second port of the first circuit. The second circuit includes a first voltage source that provides the first bias voltage and a second voltage source that provides the second bias voltage. Each one of the first voltage source and the second voltage source are coupled between separate input and output nodes of input and output ports of second circuit.

In an aspect of the subject technology, the second circuit receives the current from the first circuit and provides the current. The apparatus further includes a third circuit coupled to the second circuit that receives the current, amplifies the current, and provides an output voltage proportional to the current. In an aspect of the subject technology, the first, second, and third circuits provide fully differential signal paths. In an aspect of the subject technology, the apparatus further includes a photodetector coupled to the first port. The first bias voltage plus the common mode voltage and the second bias voltage plus the common mode voltage are applied to a cathode and an anode of the photodetector to reverse-bias the photodetector by a sum of magnitudes of the first and second bias voltages (VRB). In an aspect of the subject technology, the first bias voltage plus the common mode voltage is presented as $V_o+\frac{1}{2}V_{RB}$ that is applied to the cathode of the photodetector, and the second bias voltage plus the common mode voltage is presented as $V_o-\frac{1}{2}V_{RB}$ that is applied to the cathode of the photodetector. In an aspect of the subject technology, the photodetector is reverse-biased by the sum of the magnitudes of the first and second bias voltages. In an aspect of the subject technology, the first circuit filters an electromagnetic interference, received by the first and second nodes of the first port, and prevents the electromagnetic interference outside a frequency band of the current from reaching the third circuit.

According to aspects of the subject technology, an apparatus includes a first circuit that includes a photodetector and a second circuit coupled to the first circuit that includes a first voltage source that provides a common mode voltage ($V_o$). The apparatus also includes a third circuit coupled the second circuit that includes a first capacitor and a second capacitor. The first capacitor and the second capacitor are charged to a first voltage ($V_1$) and a second voltage ($V_2$). The first capacitor and the second capacitor provide the first voltage and the second voltage to the first circuit to be coupled to an anode and a cathode of the photodetector to reverse-bias the photodetector and the common mode voltage is applied to both the anode and the cathode of the photodetector.

In an aspect of the subject technology, the photodetector is reverse-biased by a sum ($V_{RB}$) of magnitudes of the first and second voltages, bias voltages at the cathode and the anode of the photodetector are set to $V_o+\frac{1}{2}V_{RB}$ and $V_o-\frac{1}{2}V_{RB}$ respectively, voltages at first and second nodes of a first interface between the third circuit and the second circuit are set to $V_o+\frac{1}{2}V_{RB}$ and $V_o-\frac{1}{2}V_{RB}$ respectively, and voltages at the first and second nodes of a second interface between the second circuit and the first circuit are set to $V_o+\frac{1}{2}V_{RB}$ and $V_o-\frac{1}{2}V_{RB}$ respectively. In an aspect of the subject technology, the apparatus further includes a fourth circuit coupled to the third circuit and to amplify a current of the photodetector, received via the second circuit and the third circuit, and provide an output voltage proportional to the current of the photodetector. In an aspect of the subject technology, the second circuit filters an electromagnetic interference, received by the first circuit, and prevents the electromagnetic interference from reaching the fourth circuit. In an aspect of the subject technology, the third circuit further includes first and second variable resistors, first and second operational-amplifiers (Op-Amp), third and fourth resistors such that each one of the third and fourth resistors is coupled between an inverting node and output node of one of the first and second Op-Amps, and a current source for charging the first capacitor and the second capacitor. The first and second variable resistors are used to adjust time constants of charging the first capacitor and the second capacitor. In an aspect of the subject technology, the first and the second variable resistors are implemented by metal oxide semiconductor field effect transistors in weak inversion region to increase resistances of the first and the second variable resistors and to reduce thermal noise.

Those of skill in the art would appreciate that the various illustrative blocks, modules, elements, components, memory systems, and algorithms described herein may be implemented as electronic hardware, computer software, or combinations of both. To illustrate this interchangeability of hardware and software, various illustrative blocks, modules, elements, components, memory systems, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks should be performed. Any of the blocks may be simultaneously performed. In one or more implementations, multitasking and parallel processing may be advantageous. Moreover, the separation of various system components in the embodiments described above should not be understood as requiring such separation in all embodiments, and it should be understood that the described program components and systems could generally be integrated together in a single software product or packaged into multiple software products.

As used in this specification and any claims of this application, the terms "base station," "receiver," "computer," "server," "processor," and "memory" all refer to electronic or other technological devices. These terms exclude people or groups of people. For the purposes of the specification, the term "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" and "at least one of A, B, or C" each refer to only A, only B, or only C; any combination of A, B, and C; and/or at least one of each of A, B, and C.

The predicate words "configured to," "operable to," and "programmed to" do not imply any particular tangible or intangible modification of a subject but rather are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as "an aspect," "the aspect," "another aspect," "some aspects," "one or more aspects," "an implementation," "the implementation," "another implementation," "some implementations," "one or more implementations," "an embodiment," "the embodiment," "another embodiment," "some embodiments," "one or more embodiments," "a configuration," "the configuration," "another configuration," "some configurations," "one or more configurations," "the subject technology," "the disclosure," "the present disclosure," and other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as "an aspect" or "some aspects" may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skilled in the art are expressly incorporated herein by reference and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112 (f) unless the element is expressly recited using the phrase "means for" or, in the case of a memory system claim, the element is recited using the phrase "step for."

The previous description is provided to enable any person skilled in the art to practice the various aspects described herein. Various modifications to these aspects would be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An apparatus comprising:
a photodetector, wherein the photodetector is reverse-biased by a reverse-bias voltage ($V_{PD}$), and wherein a first voltage provided to an anode of the photodetector and a second voltage provided to a cathode of the photodetector are generated based on a common mode voltage ($V_o$) and the reverse-bias voltage;
a first circuit coupled to the anode and the cathode of the photodetector and configured to provide the common mode voltage to both the anode and the cathode of the photodetector, wherein the first voltage provided to the anode is offset by a negative amount of $V_{PD}$ and the second voltage provided to the cathode is offset by a positive amount of $V_{PD}$; and
a second circuit coupled to the first circuit that comprises a first voltage source and a second voltage source and configured to provide the reverse-bias voltage for the photodetector, wherein each one of the first voltage source and the second voltage source are coupled to one of the anode or the cathode of the photodetector, wherein the second circuit is configured to receive a current of the photodetector via the first circuit and to provide the current of the photodetector at an output of the second circuit.

2. The apparatus of claim 1, wherein the first circuit comprises a third voltage source configured to generate the common mode voltage.

3. The apparatus of claim 2, wherein the first circuit comprises:
an operational-amplifier (Op-Amp), wherein an inverting node of the Op-Amp is coupled to a first node between first and second capacitors of the first circuit, an output node of the Op-Amp is coupled to a second node between third and fourth capacitors of the first circuit, and the third voltage source is coupled between a non-inverting node of the Op-Amp and a ground to provide the common mode voltage to the non-inverting node of the Op-Amp.

4. The apparatus of claim 1, further comprising:
a third circuit that comprises a low noise amplifier is coupled to the second circuit and is configured to amplify the current of the photodetector, received from the photodetector via the first circuit and the second circuit and provide an output voltage proportional to the current of the photodetector.

5. The apparatus of claim 4, wherein the first, second, and third circuits provide differential signal paths.

6. The apparatus of claim 1, wherein the second circuit is configured to provide the reverse-bias voltage, via the first circuit to the photodetector, and wherein the second circuit is configured to receive the current of the photodetector via the first circuit.

7. The apparatus of claim 1, wherein voltages at the cathode and the anode of the photodetector are set at $V_o+\frac{1}{2}V_{PD}$ and $V_o-\frac{1}{2}V_{PD}$ respectively.

8. An apparatus comprising:
a first circuit comprising a first port, a second port, and a third voltage source configured to provide a common mode voltage ($V_o$), the first circuit is configured to:
receive a current at the first port,
receive a first bias voltage at a first node of the second port and a second bias voltage having an opposite polarity of the first bias voltage at a second node of the second port, wherein the common mode voltage is added to the first and second bias voltages as an offset, and
provide the first bias voltage plus the common mode voltage at a first node of the first port and the second bias voltage plus the common mode voltage at a second node of the first port; and
a second circuit, coupled to the second port of the first circuit, the second circuit that comprises a first voltage source configured to provide the first bias voltage and a second voltage source configured to provide the second bias voltage, wherein each one of the first voltage source and the second voltage source are coupled between separate input and output nodes of input and output ports of the second circuit.

9. The apparatus of claim 8, wherein the second circuit is configured to receive the current from the first circuit and to provide the current, the apparatus further comprising:
a third circuit coupled to the second circuit and configured to receive the current, amplify the current, and provide an output voltage proportional to the current.

10. The apparatus of claim 9, wherein the first, second, and third circuits provide fully differential signal paths.

11. The apparatus of claim 8, further comprising:
a photodetector coupled to the first port, wherein the first bias voltage plus the common mode voltage and the second bias voltage plus the common mode voltage are applied to a cathode and an anode of the photodetector to reverse-bias the photodetector by a sum of magnitudes of the first and second bias voltages ($V_{PD}$).

12. The apparatus of claim 11, wherein the first bias voltage plus the common mode voltage is presented as $V_o+\frac{1}{2}V_{PD}$ that is applied to the cathode of the photodetector, and wherein the second bias voltage plus the common mode voltage is presented as $V_o-\frac{1}{2}V_{PD}$ that is applied to the cathode of the photodetector.

13. The apparatus of claim 12, wherein the photodetector is reverse-biased by the sum of the magnitudes of the first and second bias voltages.

14. The apparatus of claim 9, wherein the first circuit is configured to filter an electromagnetic interference, received by the first and second nodes of the first port, and prevent the electromagnetic interference, outside a frequency band of the current, from reaching the third circuit.

15. An apparatus comprising:
a first circuit that comprises a photodetector;
a second circuit coupled to the first circuit and comprising a first voltage source that provides a common mode voltage ($V_o$); and
a third circuit coupled the second circuit that comprises a first capacitor and a second capacitor, wherein the first capacitor and the second capacitor are configured to be charged to a first voltage ($V_1$) based on a current source provided to the third circuit and a first feedback resistor and a second voltage ($V_2$) based on the current source and a second feedback resistor, wherein the first capacitor and the second capacitor are configured to provide the first voltage and the second voltage to the first circuit to be coupled to an anode and a cathode of the photodetector to reverse-bias the photodetector, and wherein the common mode voltage is applied to both the anode and the cathode of the photodetector.

16. The apparatus of claim 15, wherein:

the photodetector is reverse-biased by a sum ($V_{PD}$) of magnitudes of the first and second voltages, bias voltages at the cathode and the anode of the photodetector are set to $V_o+\frac{1}{2}V_{PD}$ and $V_o-\frac{1}{2}V_{PD}$ respectively, voltages at first and second nodes of a first interface between the third circuit and the second circuit are set to $V_o+\frac{1}{2}V_{PD}$ and $V_o-\frac{1}{2}V_{PD}$ respectively, and voltages at the first and second nodes of a second interface between the second circuit and the first circuit are set to $V_o+\frac{1}{2}V_{PD}$ and $V_o-\frac{1}{2}V_{PD}$, respectively.

17. The apparatus of claim 15, further comprising:

a fourth circuit coupled to the third circuit and configured to amplify a current of the photodetector, received via the second circuit and the third circuit, and provide an output voltage proportional to the current of the photodetector.

18. The apparatus of claim 17, wherein the second circuit is configured to filter an electromagnetic interference, received by the first circuit, and prevent the electromagnetic interference from reaching the fourth circuit.

19. The apparatus of claim 15, wherein the third circuit further comprises:

first and second variable resistors;

first and second operational-amplifiers (Op-Amps);

third and fourth resistors, wherein each one of the third and fourth resistors is coupled between an inverting node and output node of one of the first and second Op-Amps; and a current source configured to charge the first capacitor and the second capacitor, wherein the first and second variable resistors are used to adjust time constants of charging the first capacitor and the second capacitor.

20. The apparatus of claim 19, wherein the first and the second variable resistors are implemented by metal oxide semiconductor field effect transistors in weak inversion region to increase resistances of the first and the second variable resistors and to reduce thermal noise.

* * * * *